United States Patent
Abraham et al.

(10) Patent No.: US 7,123,507 B2
(45) Date of Patent: Oct. 17, 2006

(54) USING PERMANENT MAGNETS IN MRAM TO ASSIST WRITE OPERATION

(75) Inventors: David W. Abraham, Croton, NY (US); Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/922,298

(22) Filed: Aug. 19, 2004

(65) Prior Publication Data

US 2006/0039184 A1    Feb. 23, 2006

(51) Int. Cl.
*G11C 19/02* (2006.01)
(52) U.S. Cl. .................... 365/158; 365/55; 365/157
(58) Field of Classification Search ............... None
See application file for complete search history.

(56) References Cited

U.S. PATENT DOCUMENTS

| | | | |
|---|---|---|---|
| 6,163,477 A * | 12/2000 | Tran ........................ | 365/173 |
| 6,490,217 B1 * | 12/2002 | DeBrosse et al. ......... | 365/225.5 |
| 6,509,621 B1 * | 1/2003 | Nakao ....................... | 257/421 |
| 6,522,577 B1 | 2/2003 | Earl et al. ................. | 365/158 |
| 6,621,731 B1 | 9/2003 | Bessho et al. ............. | 365/171 |
| 6,633,498 B1 | 10/2003 | Engel et al. ............... | 365/158 |

* cited by examiner

*Primary Examiner*—Tan T. Nguyen
(74) *Attorney, Agent, or Firm*—Michael J. Buchenhorner

(57) ABSTRACT

A method, information processing system and computer readable medium for transferring data between applications on a computer is disclosed. The method includes selecting data from a first application and selecting a copy-to command for copying the data selected from the first application. The method further includes selecting a second application as a destination for the data selected. The method further includes selecting a location in the second application for inserting the data selected.

12 Claims, 4 Drawing Sheets

USING PERMANENT MAGNETS IN MRAM TO ASSIST WRITE OPERATION

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of Magnetic Random Access Memory (MRAM) and more particularly relates to the field of using magnets to assist in writing to MRAM.

BACKGROUND OF THE INVENTION

Magnetic storage media are well known. Media for hard disk drives and MRAM are among the most common forms of magnetic storage media. Referring to FIG. 1, there is shown an MRAM array according to the prior art. The array includes a set of electrically conductive traces that function as parallel word lines 1, 2, and 3 in a semi-horizontal plane, and a set of electrically conductive traces that function as parallel bit lines 4, 5, 6 and 7 in another semi-vertical plane. The bit lines are oriented in a different direction, preferably at right angles to the word lines, so that the two sets of lines intersect when viewed from above. While not shown in FIG. 1, the array is formed on a substrate, such as a silicon substrate on which there would be other circuitry. Also, a layer of insulating material is located between the bit lines and word lines at regions of the MRAM other than the intersecting regions. Three word lines and four bit lines are illustrated in FIG. 1, but the number of lines would typically be much larger.

Also shown is MRAM memory cell 9 that including a magnetic tunnel junction (MTJ). The MTJ comprises a magnetically changeable or free region, and a proximate magnetic reference region, arranged into the MTJ device. The principle underlying storage of data in such cells is the ability to change the relative orientation of the magnetization of the free and reference regions by changing the direction of magnetization along the easy axis ("EA") of the free region, and the ability to thereafter read this relative orientation difference. The memory cell 9 is located at each crossing point of the word lines and bit lines in the intersection region vertically spaced between the lines.

The memory cell 9 is formed on and in contact with a word line 2. The MTJ of memory cell 9 is fabricated to have a preferred axis for the direction of magnetization called the easy axis. There are two possible directions of magnetization of the memory cell 9 along this easy axis, which defines the two states of the memory cell. The desired easy axis for the memory cell 9 is set by some combination of intrinsic anisotropy, strain-induced anisotropy and shape anisotropy of the MTJ.

An MRAM cell is written by reversing the free region magnetization using applied bi-directional electrical and resultant magnetic stimuli via its respective bitline and wordline, and is later read by measuring the resultant tunneling resistance between the bitline and wordline, which assumes one of two values depending on the relative orientation of the magnetization of the free region with respect to the reference region. FIG. 1 is an illustration of an MRAM device during an erase operation. Note the application of a first current along the word line 2 and the second current along the bit line 7, which results in writing a "0" to the memory cell 9, i.e., erasing the value of the memory cell 9. The first and second currents typically measure about 20 milliamps and are produced from a power supply measuring about 2 volts. Thus, for one erase operation, two currents of 20 milliamps each result in a power expenditure of about 40 milliamps. The magnetic field produced by the two currents typically ranges from about 20 to about 100 oersteds.

FIG. 2 is an illustration of an MRAM device during a write operation. Note the application of the first current along the word line 2 and the second current (in a direction opposite to the direction during the erase operation) along the bit line 7, which results in writing a "1" to the memory cell 9, i.e., writing a value to the memory cell 9. Again, the first and second currents typically measure about 20 milliamps and are produced from a power supply measuring about 2 volts. Thus, for one write operation, two currents of 20 milliamps each result in a power expenditure of about 40 milliamps. The magnetic field produced by the two currents typically ranges from about 20 to about 100 oersteds.

The term reference region is used broadly herein to denote any type of region which, in cooperation with the free or changeable region, results in a detectable state of the device as a whole. If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

MRAM and media for disk drives both use magnetic bits to store information. The bit is typically a submicron piece of magnetic material. For example, in MRAM the free layer of the tunnel junction is the magnetic bit; it can be an ellipse 300 nm×600 nm in area and 5 nm thick. The information is stored as the direction of magnetization of the bit, either pointing right or left, to store '1' or '0'. When the bit is in a zero applied magnetic field state, its magnetization is stable pointing either right or left. The application of a magnetic field can switch it from right to left and vice versa, to write information into the bit.

Two major types of MRAM devices exist. One of these (the first type, as described above) includes a magnetic storage element with substantially non-zero magnetic moment and with anisotropy axis substantially parallel to one of the programming current direction. The threshold of transition between the two possible stable directions of the magnetic moment is fairly well described by the Stoner-Wohlfarth model. When writing such MRAM devices, the two programming currents play different roles. The programming current that is substantially parallel to the anisotropy axis (bit-line current) determines the final state of the MRAM device, while the programming current that is substantially perpendicular to the anisotropy axis (word-line current) lowers the required bit-line current but does not prefer one state versus the other.

The other type (the second type) of MRAM device includes a magnetic storage element that constitutes two magnetically coupled elements with substantially identical magnetic moment. The magnetic coupling is such that the two magnetic elements are kept substantially anti-parallel. Furthermore, the anisotropy axis of the two magnetic elements make substantially equal angle to either programming currents. The two programming currents play similar roles during the write operation but one precedes the other temporally. A net moment is created by the early programming current and guided to rotate an angle close to 180 degrees. The early and late programming currents can be exchanged due to the fundamental symmetry of the device. When the trajectory of magnetic field encloses the so called spin-flop point, the write operation will invert the initial data in the original bit, and so the popular name of toggle MRAM arises.

For both types of MRAM, the magnitude of the programming currents is relatively large (in the range of 5 to 15 mA) compared with that normally occurs in modern digital semiconductor devices. This requirement leads to large power consumption for writing MRAM devices as well as reduced device reliability and large area. Consequently, there exists a need to reduce the write currents for both types of MRAM device.

SUMMARY OF THE INVENTION

Briefly, according to an embodiment of the present invention, a Magnetic Random Access Memory (MRAM) device is disclosed. The MRAM device includes a first linear conducting element positioned along a first axis and a second linear conducting element positioned along a second axis perpendicular to the first axis. The MRAM device further includes a magnetic element positioned at the intersection of the first linear conducting element and the second linear conducting element and a permanent magnet positioned such that its magnetic field assists in writing to the magnetic element.

In another embodiment of the present invention, the MRAM device includes a first linear conducting element positioned along a first axis and a second linear conducting element positioned along a second axis perpendicular to the first axis. The MRAM device further includes two magnetically-coupled magnetic elements positioned at the intersection of the first linear conducting element and the second linear conducting element and a permanent magnet positioned such that its magnetic field assists in writing to the two magnetically-coupled magnetic elements.

Also disclosed is a method for writing to a magnetic element in a MRAM device. The method includes providing a first linear conducting element positioned along a first axis, a second linear conducting element positioned along a second axis perpendicular to the first axis, a magnetic element positioned at the intersection of the first linear conducting element and the second linear conducting element and a permanent magnet positioned such that its magnetic field assists in writing to the magnetic element. The method further includes applying a current through the first linear conducting element and the second linear conducting element so as to write to the two magnetic elements, wherein the magnetic field of the permanent magnet assists in writing to the two magnetic elements.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DETAILED DESCRIPTION

Figure 1:
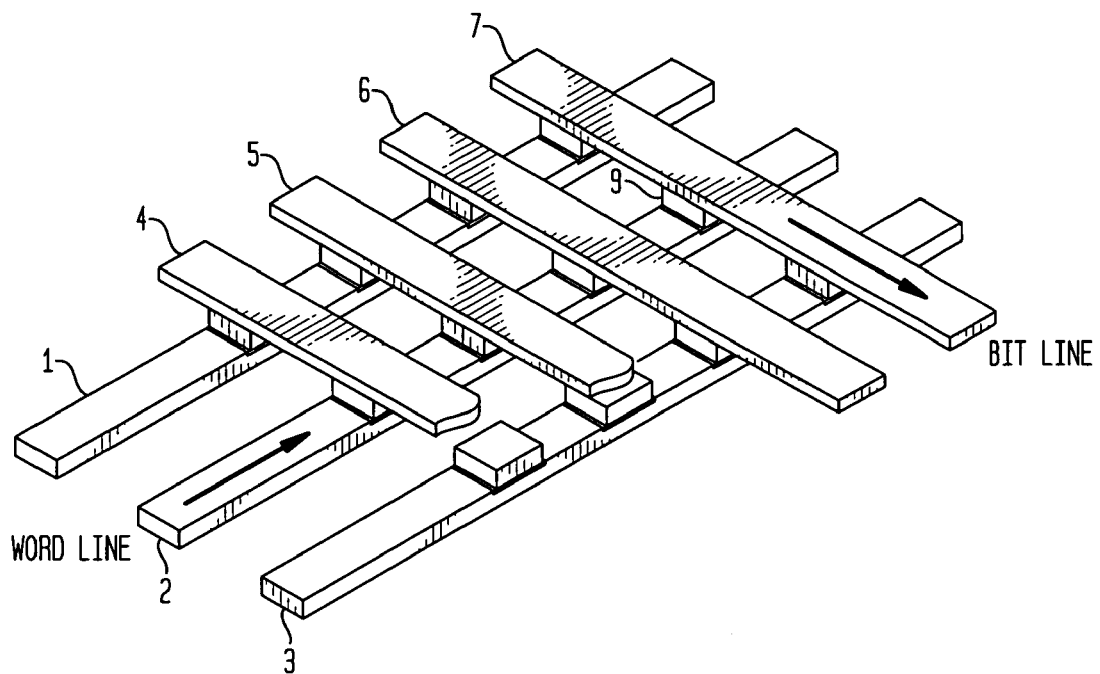
FIG. 1 is an illustration of an MRAM device during an erase operation.
Figure 2:
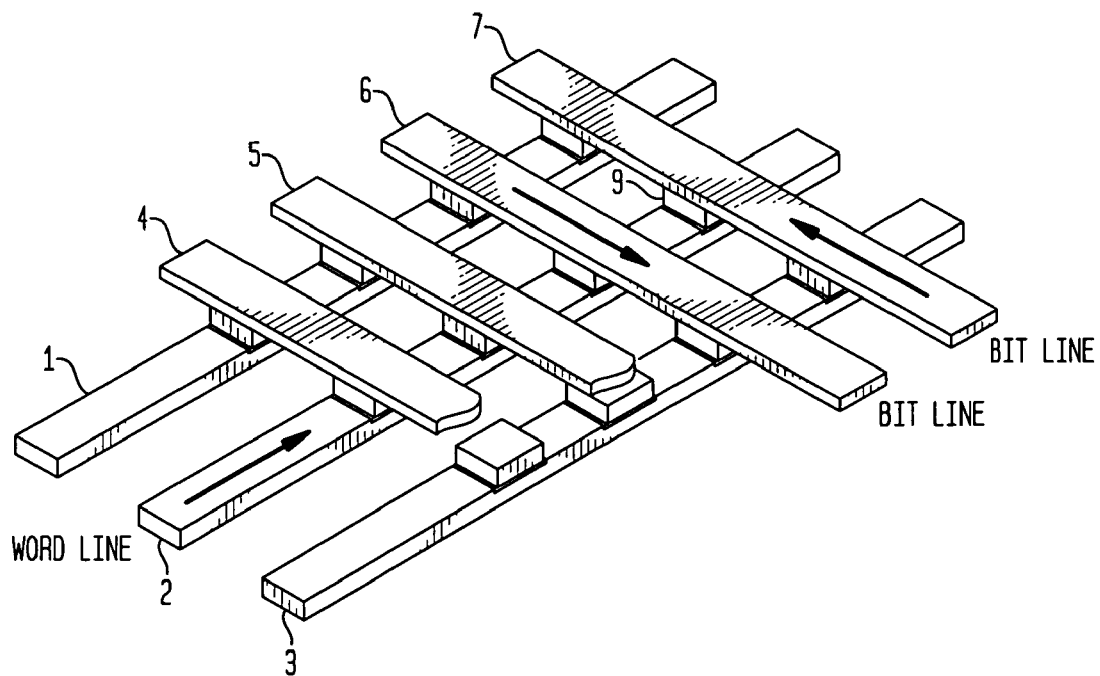
FIG. 2 is an illustration of an MRAM device during a write operation.
Figure 3:
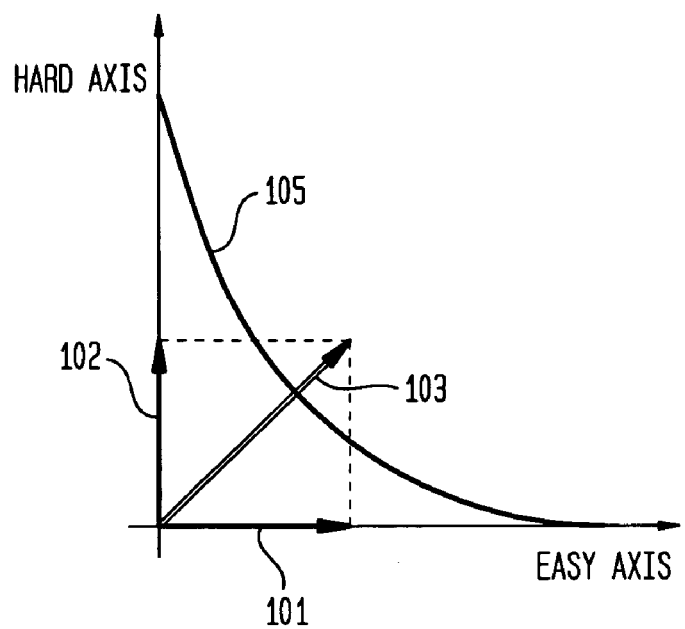
FIG. 3 is a chart showing magnetic magnitudes for a write operation in conventional MRAM of the first type.

FIG. 3 is a chart showing magnetic magnitudes for a write operation in conventional MRAM of the first type. As explained above, an MRAM cell is written by reversing the free region magnetization of a memory element using applied bi-directional electrical and resultant magnetic stimuli via its respective easy axis and hard axis, the memory element assuming one of two values depending on the relative orientation of the magnetization of the memory element. The application of a first current of magnitude 101 along the easy axis and the second current of magnitude 102 along the hard axis results in magnetic field vector sum 103 that supersedes the stability boundary 105, thereby changing the value of the memory cell. The first and second currents are produced from a power supply measuring about 2 volts, with the currents typically measuring about 20 milliamps—resulting in a power expenditure of about 40 milliamps for one write operation. The magnetic field produced by the two currents typically ranges from about 20 to about 100 oersteds.

Figure 4:
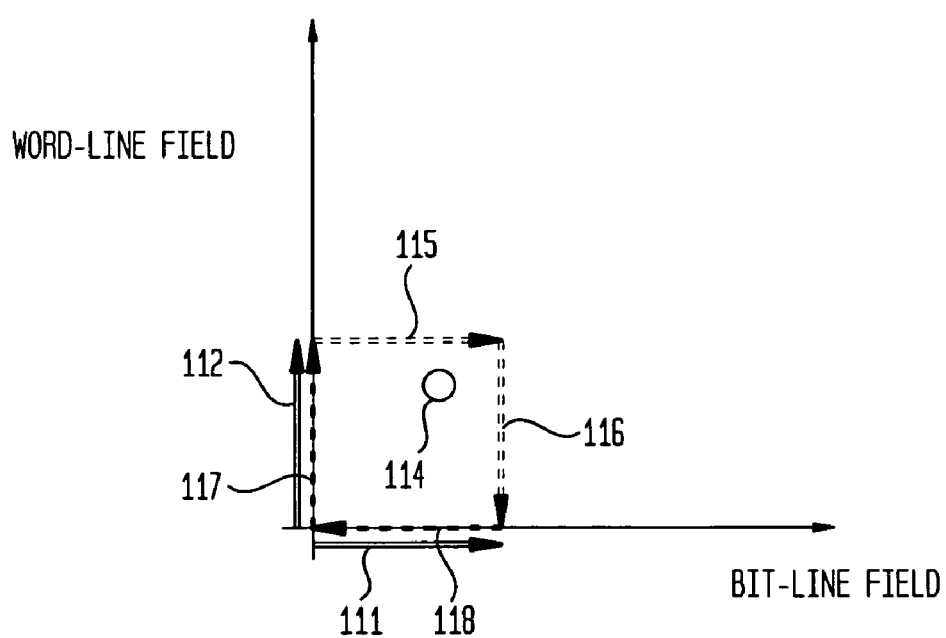
FIG. 4 is a chart showing magnetic magnitudes for a write operation in conventional MRAM of the second type.

FIG. 4 is a chart showing magnetic magnitudes for a write operation in conventional MRAM of the second type. A current 117 of magnitude 112 is applied along the word line axis and a current 115 of magnitude 111 is subsequently applied along the bit line axis. Next, a current 116 of magnitude 112 is applied along the word line axis (in a direction opposite to current 117) and a current 118 of magnitude 111 is subsequently applied along the bit line axis (in a direction opposite to current 115). The above sequence of currents result in a field trajectory that encloses the spin-flop point 114 of the magnetic storage element. This results in the changing of the value of the memory cell. Note that the field trajectory can be applied in a reverse direction. As above, the currents are produced from a power supply measuring about 2 volts, with the currents typically measuring about 20 milliamps. The magnetic field produced by the two currents typically ranges from about 20 to about 100 oersteds.

Figure 5:
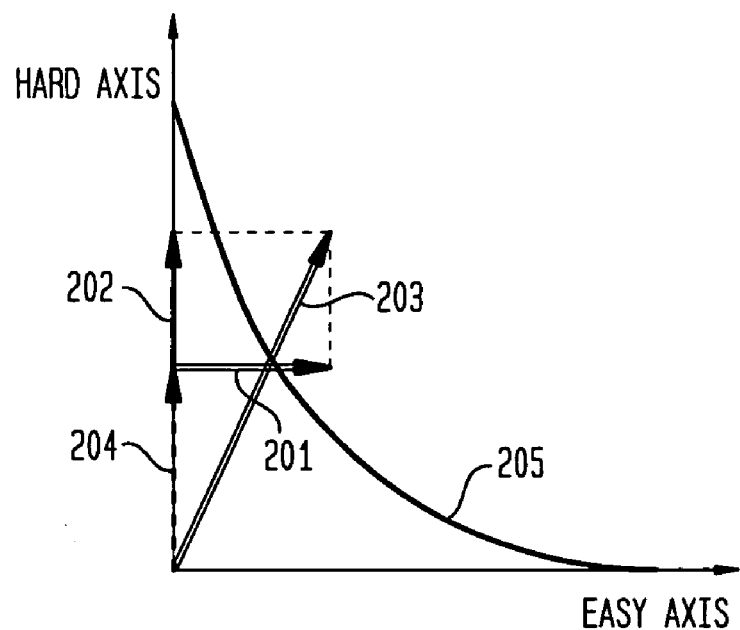
FIG. 5 is a chart showing magnetic magnitudes for a write operation in MRAM of the first type, according to one embodiment of the present invention.

FIG. 5 is a chart showing magnetic magnitudes for a write operation in MRAM of the first type, according to one embodiment of the present invention. The magnetic field components 201 (applied along the easy axis) and 202 (applied along the hard axis) are generated by programming currents. The magnetic field component 204 from permanent magnets placed close to the MRAM chip is directed substantially along the hard axis. The vector sum of all magnetic field components 203 exceeds the stability boundary 205 for a successful write operation. The vector sum 206 of magnetic field component from permanent magnets 204 and either one of the components 201 or 202 generated by programming currents must, however, stay within the stability boundary 205 in order to prevent half-selected cells from switching values.

It should be noted that the said magnetic field component 204 from permanent magnets placed close to the MRAM chip has magnitude substantially similar to the field components generated by the programming currents 201 and 202. The said magnetic field component 204 from permanent magnets effectively offset the intrinsic astroid curve (stability boundary) from the origin of the programming field so that less programming field is required. The reduction in required programming currents reduces power consumption and improves device reliability. The programming currents are produced from a power supply measuring about 1 volt, with the currents typically measuring about 10 milliamps—resulting in a power expenditure of about 20 milliamps for one write operation. The magnetic field produced by the permanent magnets would range from about 4 to about 80 oersteds.

Figure 6:
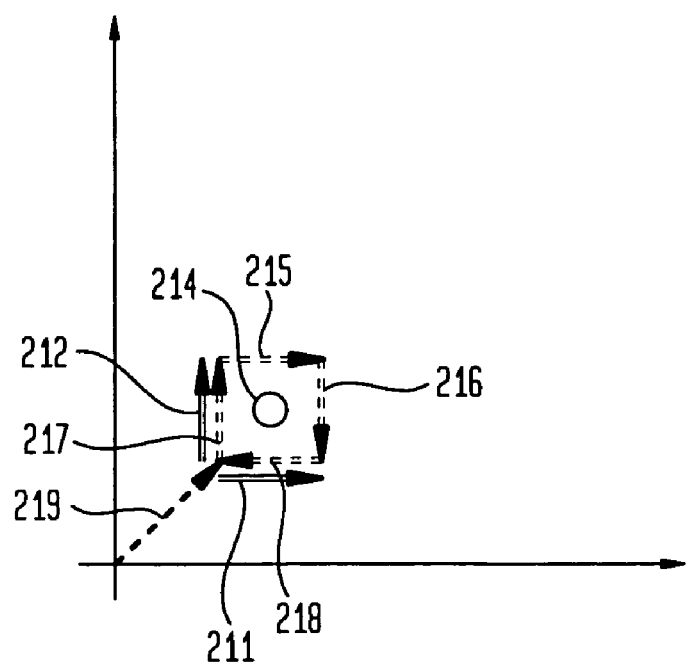
FIG. 6 is a chart showing magnetic magnitudes for a write operation in MRAM of the second type, according to one embodiment of the present invention.

FIG. 6 is a chart showing magnetic magnitudes for a write operation in MRAM of the second type, according to one embodiment of the present invention. The magnetic field component 219 from permanent magnets placed close to the MRAM chip is directed substantially along 45 degrees from the easy or hard axis. The trajectory of all magnetic field components must enclose the spin-flop point 214 for a successful toggle write operation. A current 217 of magnitude 212 is applied along the word line axis and a current 215 of magnitude 211 is subsequently applied along the bit line axis. Next, a current 216 of magnitude 212 is applied along the word line axis (in a direction opposite to current 217) and a current 218 of magnitude 211 is subsequently applied along the bit line axis (in a direction opposite to current 215). The above sequence of currents result in a field trajectory that encloses the spin-flop point 214 of the magnetic storage element. This results in the changing of the value of the memory cell.

It should be noted that the said magnetic field component 219 from permanent magnets placed close to the MRAM chip has magnitude substantially similar to the field components generated by the programming currents 211 and 212. The said magnetic field component 219 from permanent magnets effectively offset the intrinsic spin-flop point from the origin of the programming field so that less programming field is required. The reduction in required programming currents reduces power consumption and improves device reliability.

Figure 7:
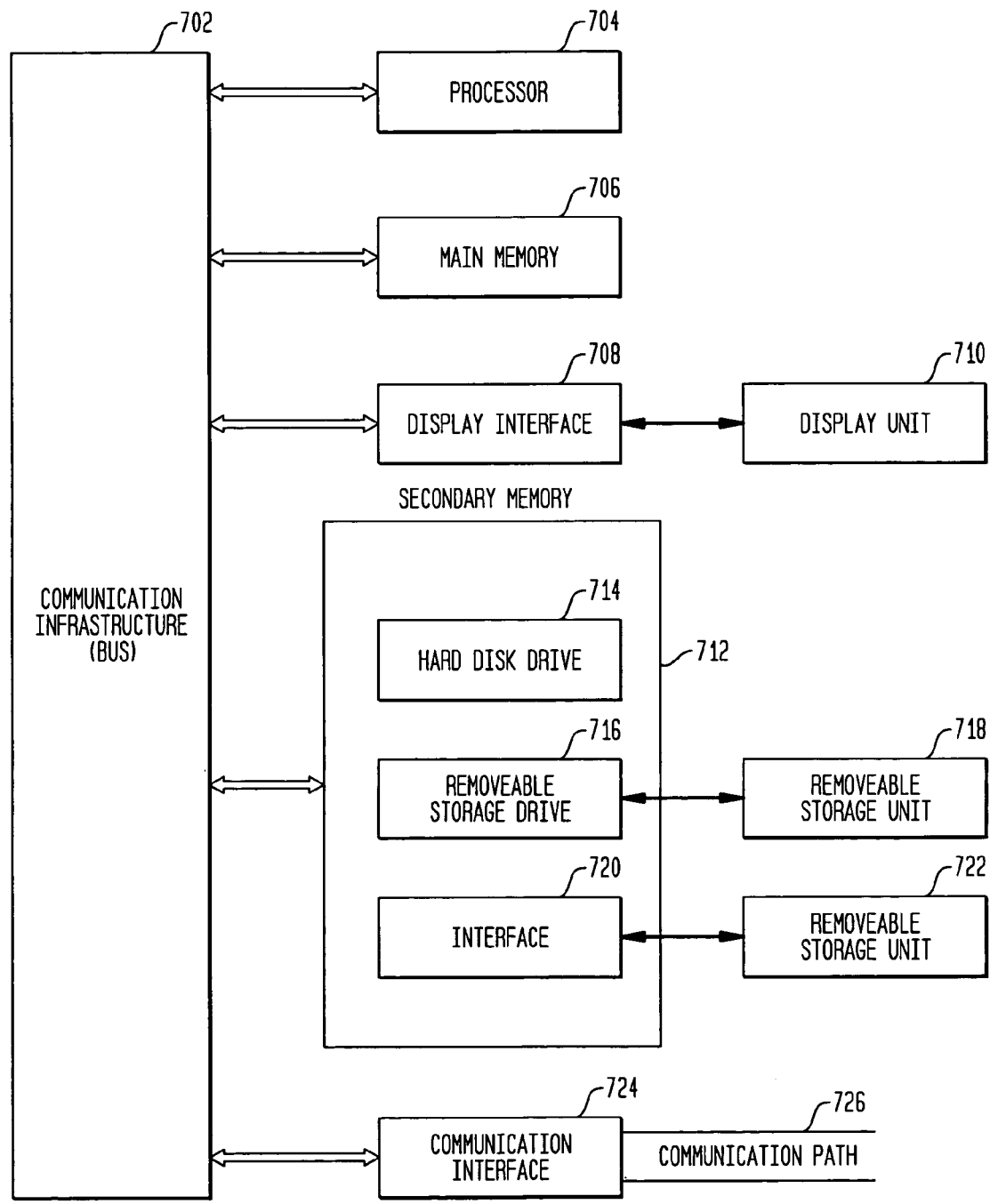
FIG. 7 is a high level block diagram showing an information processing system useful for implementing one embodiment of the present invention.

FIG. 7 is a high level block diagram showing an information processing system useful for implementing one embodiment of the present invention. The computer system includes one or more processors, such as processor 704. The processor 704 is connected to a communication infrastructure 702 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 708 that forwards graphics, text, and other data from the communication infrastructure 702 (or from a frame buffer not shown) for display on the display unit 710. The computer system also includes a main memory 706, including MRAM implementing the features of the present invention (as described herein), and may also include a secondary memory 712. The secondary memory 712 may include, for example, a hard disk drive 714 and/or a removable storage drive 716, representing a floppy disk drive, a magnetic tape drive, an optical disk drive, etc. The removable storage drive 716 reads from and/or writes to a removable storage unit 718 in a manner well known to those having ordinary skill in the art. Removable storage unit 718, represents a floppy disk, a compact disc, magnetic tape, optical disk, etc. which is read by and written to by removable storage drive 716. As will be appreciated, the removable storage unit 718 includes a computer readable medium having stored therein computer software and/or data.

In alternative embodiments, the secondary memory 712 may include other similar means for allowing computer programs or other instructions to be loaded into the computer system. Such means may include, for example, a removable storage unit 722 and an interface 720. Examples of such may include a program cartridge and cartridge interface (such as that found in video game devices), a removable memory chip (such as an EPROM, or PROM) and associated socket, and other removable storage units 722 and interfaces 720 which allow software and data to be transferred from the removable storage unit 722 to the computer system.

The computer system may also include a communications interface 724. Communications interface 724 allows software and data to be transferred between the computer system and external devices. Examples of communications interface 724 may include a modem, a network interface (such as an Ethernet card), a communications port, a PCM-CIA slot and card, etc. Software and data transferred via communications interface 724 are in the form of signals which may be, for example, electronic, electromagnetic, optical, or other signals capable of being received by communications interface 724. These signals are provided to communications interface 724 via a communications path (i.e., channel) 726. This channel 726 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 706 and secondary memory 712, removable storage drive 716, a hard disk installed in hard disk drive 714, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information.

Computer programs (also called computer control logic) are stored in main memory 706 and/or secondary memory 712. Computer programs may also be received via communications interface 724. Such computer programs, when executed, enable the computer system to perform the features of the present invention as discussed herein. In particular, the computer programs, when executed, enable the processor 704 to perform the features of the computer system. Accordingly, such computer programs represent controllers of the computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

We claim:

1. A Magnetic Random Access Memory (MRAM) device having a hard axis and an easy axis, comprising:
    a first linear conducting element positioned along a first axis;
    a second linear conducting element positioned along a second axis perpendicular to the first axis;
    a magnetic element positioned at the intersection of the first linear conducting element and the second linear conducting element; and
    a permanent-magnet permanently positioned placed close to the MRAM device and external to the magnetic element for providing an external assistive magnetic field to reduce writing currents, wherein a magnetic field component from the permanent magnet is directed substantially along the hard axis and a vector sum of all magnetic field components exceeds a stability boundary for a write operation, and wherein the vector sum of the magnetic field component from permanent magnet and either one of the components generated by programming currents stays within the stability boundary in order to prevent half-selected cells from switching values.

2. The MRAM device of claim 1, further comprising:
    a current source for applying a current through the first linear conducting element and the second linear conducting element so as to write to the magnetic element, wherein the magnetic field of the permanent magnet assists in writing to the magnetic element.

3. The MRAM device of claim 2, wherein the first linear conducting element is a bitline and the second linear conducting element is a wordline.

4. The MRAM device of claim 2, wherein the magnetic element comprises a memory cell.

5. The MRAM device of claim 2, wherein the magnetic element comprises a magnetically susceptible material.

6. The MRAM device of claim 2, wherein the magnetic field of the permanent magnet radiates in the direction of the first axis.

7. The MRAM device of claim 2, wherein the amplitude of the magnetic field of the permanent magnet is substantially equal to or less than the amplitude of magnetic fields produced by the current applied through the first linear conducting element and the second linear conducting element.

8. A Magnetic Random Access Memory (MRAM) device, comprising:
    a first linear conducting element positioned along a first axis;
    a second linear conducting element positioned along a second axis perpendicular to the first axis;
    two magnetically-coupled magnetic elements positioned at the intersection of the first linear conducting element and the second linear conducting element; and
    a permanent magnet permanently positioned external to the magnetic elements for providing an external assistive magnetic field to reduce writing currents, wherein a magnetic field component from the permanent magnet is directed substantially along a hard axis and a vector sum of all magnetic field components exceeds a stability boundary for a write operation, and wherein the vector sum of the magnetic field component from the permanent magnets and wherein either one of the components generated by programming currents stays within the stability boundary in order to prevent half-selected cells from switching values.

9. The MRAM device of claim 8, further comprising:
    a current source for applying a current through the first linear conducting element and the second linear conducting element so as to write to the two magnetic elements, wherein the magnetic field of the permanent magnet assists in writing to the two magnetic elements.

10. The MRAM device of claim 9, wherein the magnetic field of the permanent magnet radiates in the direction of the first axis.

11. The MRAM device of claim 9, wherein the amplitude of the magnetic field of the permanent magnet is substantially equal to or less than the amplitude of magnetic fields produced by the current applied through the first linear conducting element and the second linear conducting element.

12. A method for writing to a magnetic element in a Magnetic Random Access Memory (MRAM) device, the method comprising:
    providing a first linear conducting element positioned along a first axis, a second linear conducting element positioned along a second axis perpendicular to the first axis, a magnetic element positioned at the intersection of the first linear conducting element and the second linear conducting element and a permanent magnet positioned such that its magnetic field assists in writing to the magnetic element for providing an external assistive magnetic field to reduce writing currents; and
    applying a current through the first linear conducting element and the second linear conducting element so as to write to the two magnetic elements, wherein the magnetic field of the permanent magnet assists in writing to the two magnetic elements, wherein a magnetic field component from the permanent magnet is directed substantially along a hard axis and a vector sum of all magnetic field components exceeds a stability boundary for a write operation, the vector sum of the magnetic field component from permanent magnets and wherein either one of the components generated by programming currents stays within the stability boundary in order to prevent half-selected cells from switching values.

* * * * *